(12) United States Patent
Novellini et al.

(10) Patent No.: US 7,917,797 B2
(45) Date of Patent: Mar. 29, 2011

(54) CLOCK GENERATION USING A FRACTIONAL PHASE DETECTOR

(75) Inventors: Paolo Novellini, Gorgonzola (IT); Silvio Cucchi, Gaggiano (IT); Giovanni Guasti, Cornaredo (IT)

(73) Assignee: Xilinx, Inc., San Jose, CA (US)

( * ) Notice: Subject to any disclaimer, the term of this patent is extended or adjusted under 35 U.S.C. 154(b) by 502 days.

(21) Appl. No.: 12/125,270

(22) Filed: May 22, 2008

(65) Prior Publication Data
US 2009/0289667 A1 Nov. 26, 2009

(51) Int. Cl.
*G06F 1/08* (2006.01)

(52) U.S. Cl. ......... 713/501; 713/500; 327/156; 327/163

(58) Field of Classification Search .................. 713/500, 713/501; 327/156, 163
See application file for complete search history.

(56) References Cited

U.S. PATENT DOCUMENTS

| | | | |
|---|---|---|---|
| 5,907,253 A | 5/1999 | Davis et al. | |
| 6,779,010 B2* | 8/2004 | Humphreys et al. | 708/490 |
| 6,809,598 B1 | 10/2004 | Staszewski et al. | |
| 7,262,645 B2* | 8/2007 | Lee et al. | 327/141 |
| 7,369,637 B1* | 5/2008 | Mauer | 375/372 |
| 7,493,510 B2* | 2/2009 | Sung et al. | 713/503 |
| 2003/0174797 A1 | 9/2003 | Grushin | |

FOREIGN PATENT DOCUMENTS
EP 1 178 609 A2 2/2002

OTHER PUBLICATIONS

Farrow, C.W.; "A Continuously Variable Digital Delay Element"; Copyright 1988 IEEE; ISCAS'88; pp. 2641 thru 2645.
Snow, John F.; "Efficient 8X Oversampling Asynchronous Serial Data Recovery Using IDELAY"; XAPP861; (v1.1); Jul. 20, 2007; available from www.xilinx.com; pp. 1-11.
Venkatavaradan, Vinod Kumar; "Virtex-II Pro RocketIO Transceiver with 3X Oversampling for 1G Fibre Channel"; XAPP581; (v1.0); Oct. 6, 2006; available from www.xilinx.com; pp. 1-13.
Chuang, Jerry; "A 3/4/5/6X Oversampling Circuit for 200 Mb/s to 1000 Mb/s Serial Interfaces"; XAPP572; (v1.0); Nov. 18, 2004; available from www.xilinx.com; pp. 1-13.
Xilinx, Inc.; "Virtex-5 RocketIO GTP Transceiver User Guide"; UG196; (v1.4); Sep. 12, 2007; available from Xilinx, Inc., 2100 Logic Drive, San Jose, California 95124; pp. 1-318.
Xilinx, Inc.; "Virtex-4 RocketIO Multi-Gigabit Transceiver—User Guide"; UG076; (v4.0); Aug. 17, 2007; available from Xilinx, Inc., 2100 Logic Drive, San Jose, California 95124; pp. 1-339.

* cited by examiner

*Primary Examiner* — Thuan N Du
(74) *Attorney, Agent, or Firm* — LeRoy D. Maunu; Lois D. Cartier

(57) ABSTRACT

Circuits are provided that generate from an input signal one or more output clock signals having reduced skew. The input signal has transitions derived from the transitions of an original clock signal having a frequency that differs from the frequency of the output clock signal. The frequency of the output clock signal is a product from multiplying the frequency for the input signal and an integer ratio. The circuit includes an accumulator, a fractional phase detector, and a loop filter. The accumulator periodically adds a numerical offset value to a numerical phase value. The output clock signal is generated from this numerical phase value. The fractional phase detector generates from the numerical phase value a respective numerical phase error for each of the transitions of the input signal. The loop filter generates the numerical offset value from a filtering of the respective numerical phase errors.

19 Claims, 4 Drawing Sheets

CLOCK GENERATION USING A FRACTIONAL PHASE DETECTOR

FIELD OF THE INVENTION

The present invention generally relates to synthesis of clocks, and more particularly to accumulator-based synthesis of clocks, starting from clock or data.

BACKGROUND

Electronic circuits frequently exchange data between multiple clock domains. An example electronic switch transfers digital telecommunications between a T1 interface transferring data at a rate of 1.544 megabits per second and an E1 interface transferring data at a rate of 2.048 megabits per second. The example electronic switch reformats the data exchanged between the T1 and E1 interfaces, including changing the rate of data transfer.

While an electronic circuit can have asynchronous clock domains that exchange data using complex synchronizer circuits, a simpler electronic circuit frequently results from using synchronous clock domains that directly exchange data. For the example electronic switch, the T1 and E1 interfaces can operate synchronously using a 2.048 MHz clock for the E1 interface that is a synchronous ratio of 256/193 times a 1.544 MHz clock for the T1 interface. Generally, two synchronous clock domains have respective clocks related by a ratio of integers.

A phase-locked loop, for example, can synthesize an output clock with a frequency that is a ratio of a numerator integer over a denominator integer times the frequency of an input clock. The phase-locked loop compares the phase of the input clock divided by the denominator integer with the phase of the output clock divided by the numerator integer. Thus, the phase-locked loop compares the phase of the input and output clocks at only a fraction of the transitions of the input clock; the fraction is one divided by the denominator integer. When the denominator integer is large, the phase-locked loop ignores the phase information available at most transitions of the input clock.

A clock domain in a hypothetical application requires a clock that meets certain specifications, such as a limit on the jitter of the clock. The clock for the clock domain can have excessive jitter when a phase-locked loop generates the clock by ignoring the phase information at most transitions of an input clock.

The present invention may address one or more of the above issues.

SUMMARY

Various embodiments of the invention provide circuits that generate one or more output clock signals from an input signal. The input signal has transitions derived from the transitions of an original clock signal having a frequency that differs from the frequency of an output clock signal. The frequency of the output clock signal is a product from multiplying the frequency for the input signal and an integer ratio. The circuit includes an accumulator, a fractional phase detector, and a loop filter. The accumulator periodically adds a numerical offset value to a numerical phase value. The output clock signal is generated from this numerical phase value. The fractional phase detector generates from the numerical phase value a respective numerical phase error for each of the transitions of the input signal. The loop filter generates the numerical offset value from a filtering of the respective numerical phase errors.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

Figure 1:
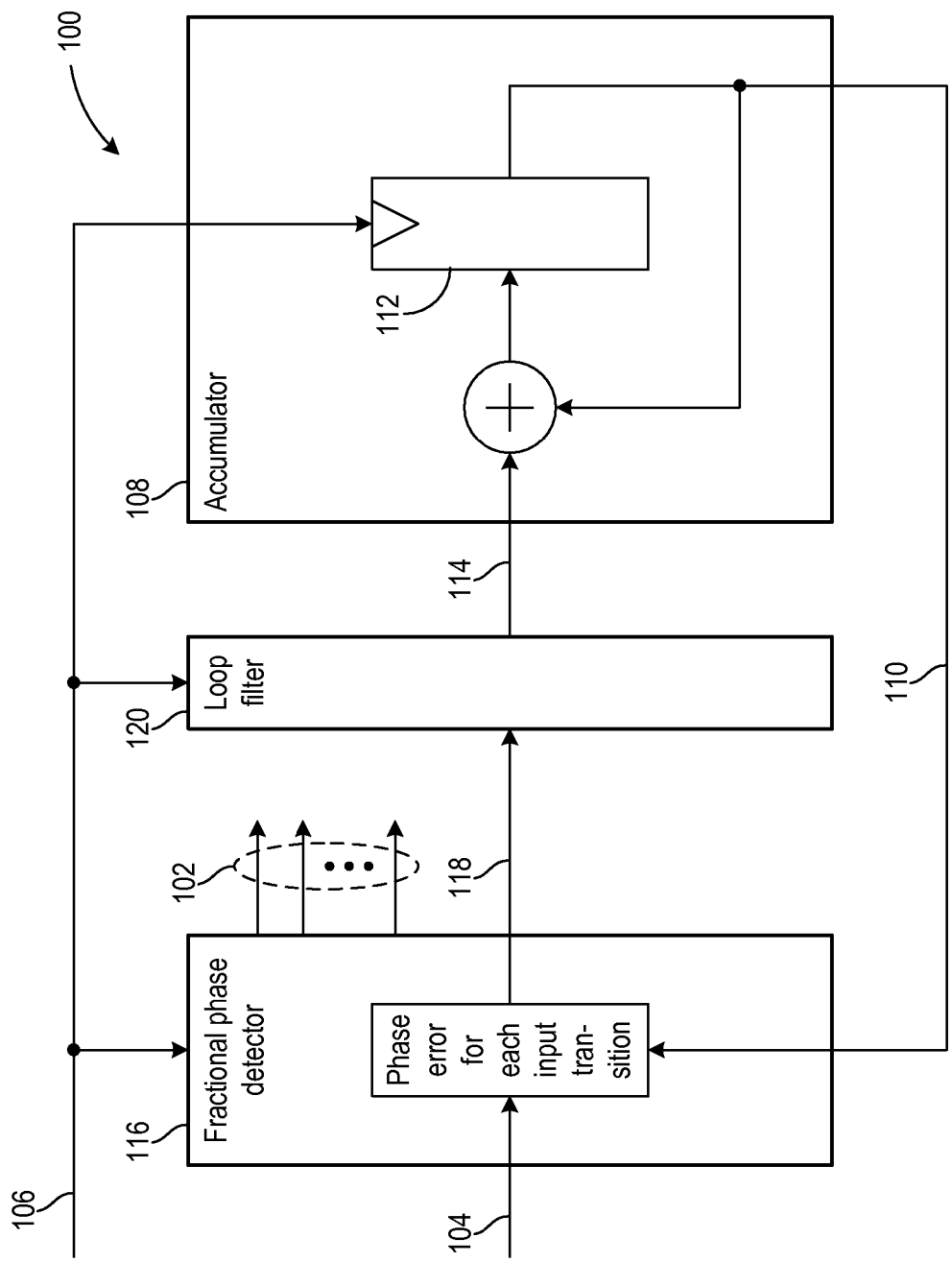
FIG. 1 is a block diagram of a circuit for generating one or more output clock signals from an input signal in accordance with various embodiments of the invention.

FIG. 1 is a block diagram of a circuit 100 for generating one or more output clock signals on lines 102 from an input signal on line 104 in accordance with various embodiments of the invention. In one embodiment, the input signal on line 104 is an input clock signal, and the circuit generates an output clock signal with a different frequency from the input clock signal. In another embodiment, the input signal on line 104 is a data signal with data transitions associated with a clock signal (referred to herein as an original clock signal), and the circuit generates an output clock signal with a different frequency from the original clock signal. In yet another embodiment, the input signal on line 104 can be either a clock signal or a data signal. The frequency of each output clock signal is some integer ratio N/M times the frequency of the original clock for the input signal. Note that the "original clock signal" can be either the same as the input clock signal (when the input signal is a clock signal) or the clock signal associated with data transitions of the input signal (when the input signal is a data signal).

The clock generating circuit 100 operates under the control of a high-frequency clock signal on line 106, which is also referred to herein as the "control clock". Generally, the frequency of the high-frequency clock signal on line 106 is higher than the frequency of the clock for the input signal on line 104 and is higher than the frequency of each of the output clock signals on lines 102. Circuit 100 effectively selects the transitions of each output clock signal from the transitions of the high-frequency clock signal on line 106. Thus, each output clock has jitter, and the period of the high-frequency clock signal determines a lower limit on the amount of the jitter. However, various embodiments have an amount of jitter near this lower limit, because circuit 100 adjusts the phases of the output clock signals on lines 102 at every transition of the input signal on line 104. In contrast, prior art approaches adjust the phase of an output clock signal at only one out of every M transitions of the input signal. Because circuit 100 adjusts the phase of the output clock signal more frequently than prior art approaches, various embodiments generate one or more output clock signals having less jitter than the prior art.

An accumulator 108 digitally tracks the numerical phase value for the feedback on line 110. The accumulator includes a register 112 for storing the numerical phase value for the feedback on line 110. During each cycle of the high-frequency clock signal on line 106, accumulator 108 adds a numerical offset value on line 114 to the numerical phase value stored in register 112. The nominal value of the numerical offset value on line 114 is the fractional amount of phase change that is required for the feedback on line 110 during each cycle of the high-frequency clock signal on line 106. Circuit 100 varies the numerical offset value on line 114 from the nominal value to synchronize the feedback on line 110 with the input signal on line 104.

Fractional phase detector 116 generates a numerical phase error on line 118 for each transition of the input signal on line 104. The numerical phase error on line 118 is a phase difference between the feedback on line 110 and the transitions of the input signal on line 104. When the feedback on line 110 becomes synchronized with the input signal on line 104, the numerical phase error on line 118 approaches a digital value of zero. Because the high-frequency clock signal on line 106 operates at a higher frequency than the original clock producing the transitions in the input signal on line 104, fractional phase detector 116 outputs a numerical phase error on line 118 only in certain cycles of the high-frequency clock signal on line 106. In the pictured embodiment, fractional phase detector 116 also generates the output clock signals on lines 102 from the feedback on line 110. In other embodiments, the output clock signals are generated by a separate generator circuit.

The loop filter 120 filters the numerical phase error on line 118 to generate the numerical offset value on line 114. The loop filter 120 receives an updated value of the numerical phase error on line 118 during certain cycles of the high-frequency clock signal on line 106. However, the loop filter 120 generates an offset value on line 114 that is valid for every cycle of the high-frequency clock signal on line 106, and the accumulator 108 adds this offset value on line 114 to the current value of register 112 during every cycle of the high-frequency clock signal on line 106.

Figure 2:
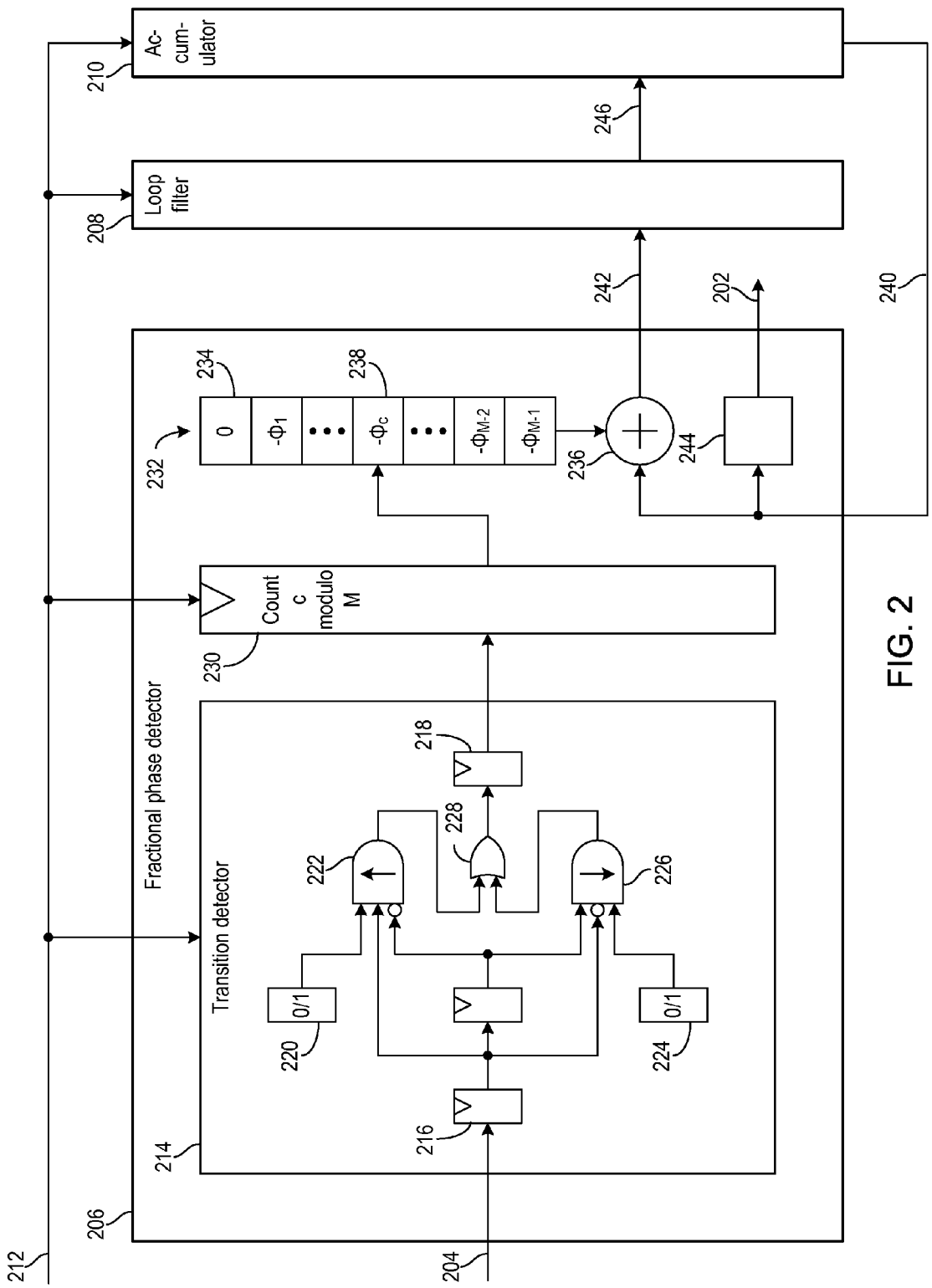
FIG. 2 is a block diagram of a circuit for generating an output clock signal from an input clock signal in accordance with various embodiments of the invention.

FIG. 2 is a block diagram of a circuit for generating an output clock signal on line 202 from an input clock signal on line 204 in accordance with various embodiments of the invention. The input signal on line 204 generally cannot be a data signal in this embodiment. The output clock signal on line 202 has a frequency that multiplies the frequency of the input clock signal on line 204 by a ratio N/M of integers N and M. The fractional phase detector 206, a loop filter 208, and an accumulator 210 operate under the control of a high-frequency clock signal on line 212.

Transition detector 214 of fractional phase detector 206 detects transitions of the input clock signal on line 204. In one embodiment, the high-frequency clock signal on line 212 and the input clock signal on line 204 are asynchronous clock signals derived from independent sources, and transition detector 214 additionally provides a synchronizer for synchronizing signal 204 with the clock domain of the high-frequency clock signal on line 212. Thus, the high-frequency clock signal on line 212 can cause register 216 to sample during a transition of the input clock signal on line 204, such that the output of register 216 is metastable. However, transition detector 214 generally resolves this metastability, such that the output of register 218 is synchronous to the high-frequency clock signal on line 212 without being metastable.

Transition detector 214 is configurable to detect rising transitions and/or falling transitions of the input clock signal on line 204. If configuration register 220 is set to a high value, then gate 222 outputs a single cycle of an asserted value for each rising transition of the input clock signal on line 204. Similarly, if configuration register 224 is set to a high value, then gate 226 outputs a single cycle of an asserted value for each falling transition of the input clock signal on line 204. Gate 228 combines any asserted values from gates 222 and 226. Thus, transition detector 214 is configurable to detect only rising transitions, only falling transitions, or both rising and falling transitions, based on the values stored in configuration registers 220 and 224.

Configuring transition detector 214 to detect both rising and falling transitions permits transition detector 214 to provide phase information more frequently from the input clock signal on line 204. More frequently provided phase information might improve synchronization in certain applications. However, in an application with an asymmetrical duty cycle for the input clock signal on line 204, the phases of the rising transitions might differ substantially from the phases of the falling transitions. Thus, improved synchronization might result from configuring transition detector 214 to detect only rising transitions or to detect only falling transitions.

The output clock signal on line 202 has a frequency that multiplies the frequency of the input clock signal on line 204 by a ratio N/M of integers N and M. Thus, the time interval for M cycles of the input clock signal on line 204 matches the time interval for N cycles of the output clock signal on line 202. In one embodiment, the input and output clock signals ideally have simultaneous rising transitions at the beginning of each of these matching intervals. For the rising transition of the input clock signal at the beginning of each matching interval, the ideal phase difference between the input clock signal on line 204 and the output clock signal on line 202 is a phase difference of zero. Within each matching interval, the M rising transitions of the input clock signal on line 204 each similarly have an ideal phase difference relative to the output clock signal on line 202.

Counter 230 counts transitions of the input clock signal on line 204. In one embodiment, counter 230 counts rising transitions modulo M and the value of counter 230 specifies the current rising transition within the current matching interval. A count value of zero specifies that the current rising transition is the rising transition at the beginning of a new matching interval. Table 232 includes corresponding phase compensation values for each possible value of the count from counter 230. For example, value 234 is a phase compensation value of zero for the count value of zero. The values in table 232 are readily calculated in advance from the values of M and N.

Adder 236 digitally adds the phase compensation value 238 for the current value c of counter 230 to the feedback phase value on line 240. This addition adjusts the feedback phase value on line 240 to create a phase error value on line 242. After achieving synchronization between the output clock signal on line 202 and the input clock signal on line 204, the nominal phase error value on line 242 is a value of zero. For each detected transition of the input clock signal on line 204, fractional phase detector 206 generates a phase error value on line 242 that specifies the phase of the detected transition relative to the phase of the output clock signal on line 202.

Generator 244 generates the output clock signal on line 202 from the feedback phase value on line 240. In one embodiment, the feedback phase value on line 240 is a binary fractional value, and generator 244 extracts the most significant bit of this binary fractional value to produce the output clock signal on line 202. In another embodiment, generator 244 generates a plurality of multi-phase clock signals. Note that generator 244 is shown in FIG. 2 as being included in fractional phase detector 206, for clarity. However, generator 244 can be implemented as a circuit separate from fractional phase detector 206, if desired.

Loop filter 208 filters the intermittently received phase error values on line 242 to generate the continuously available offset value on line 246. Each cycle of the high-frequency clock signal on line 212, accumulator 210 accumulates the offset value on line 246 to produce the feedback phase value on line 240 for the output clock signal on line 202.

Figure 3:
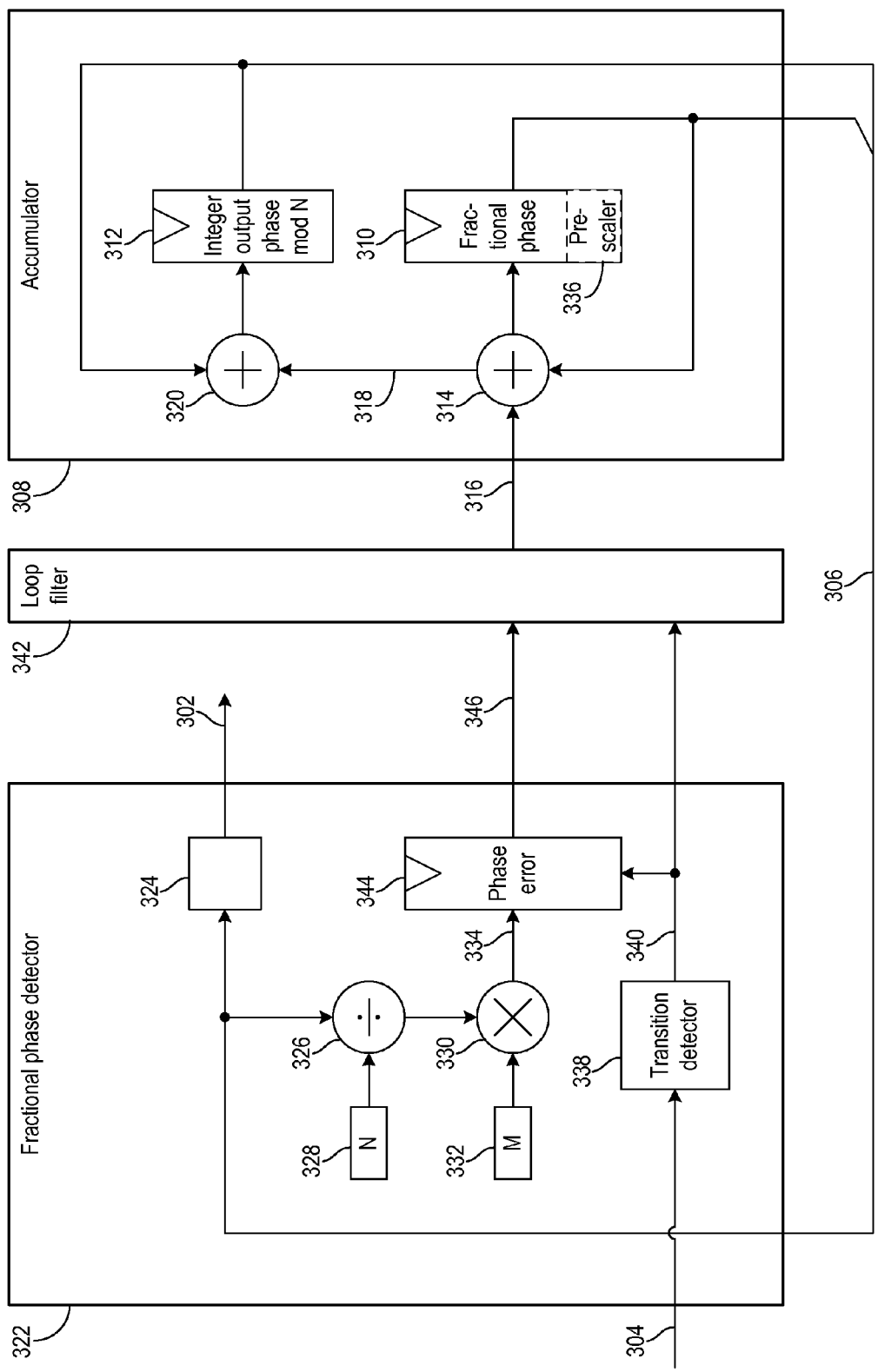
FIG. 3 is a block diagram of a circuit for generating an output clock signal from an input clock or data signal in accordance with various embodiments of the invention.

FIG. 3 is a block diagram of a circuit for generating an output clock signal on line 302 from an input clock or data signal on line 304 in accordance with various embodiments of the invention. A numerical phase value on line 306 provides the phase of the output clock signal on line 302, and the numerical phase value on line 306 is periodically updated during each cycle of a high-frequency clock (not shown in FIG. 3).

Because the output clock signal on line 302 has a frequency that multiplies the frequency of the original clock of the input signal on line 304 by a ratio N/M of integers N and M, a corresponding matching time interval includes M cycles of the original clock of the input signal on line 304 and N cycles of the output clock signal on line 302.

Accumulator 308 tracks the phase of the output clock signal on line 302 within each matching interval. Accumulator 308 includes a register 310 for storing the current phase of the output clock signal on line 302 within each cycle of the output clock signal. Because each matching interval includes N cycles of the output clock signal on line 302, register 310 stores the current phase of the output clock signal on line 302 within any of the N cycles of each matching interval. Accumulator 308 also includes a register 312 that indicates the current one of the N cycles of each matching interval. Together, registers 310 and 312 provide the current phase on line 306 of the output clock signal on line 302 within each matching interval.

Because the high-frequency clock has a higher frequency than the output clock signal on line 302 and register 310 is updated in each cycle of the high-frequency clock, the phase value stored in register 310 is incremented by a fractional phase amount during each cycle of the high-frequency clock. For example, if the high-frequency clock has a frequency that is ten times higher than the frequency of the output clock signal on line 302, then the value in register 310 is nominally incremented by thirty-six degrees of phase during each cycle of the high-frequency clock. In one embodiment, the 360-degrees of phase is divided into $2^K$ increments and register 310 stores a K-bit binary fraction. Each cycle of the high-frequency clock, adder 314 adds the appropriate fractional offset value on line 316 to the current fractional phase in register 310.

If adder 314 generates a carry out on line 318, then the fractional phase value in register 310 becomes the phase of the next cycle of the output clock signal on line 302. Adder 320 then increments the value of the integer phase value in register 312. Adder 320 adds modulo N because register 312 tracks the current cycle of the output clock signal within the N cycles for each matching interval. In one embodiment, register 312 stores a J-bit binary integer value, with J equaling or exceeding the base-two logarithm of N rounded up to the next highest integer.

The feedback phase value on line 306 combines the fractional phase value from register 310 with the integer phase value from register 312. In one embodiment, the feedback phase value on line 306 is a binary number with a fractional part from register 310 and an integer part from register 312. The feedback phase value on line 306 specifies the phase of the output clock signal on line 302 within the matching interval of N cycles of the output clock signal on line 302. In addition, the feedback phase value on line 306 provides enough information to determine the expected phase of the input signal on line 304 within the matching interval of M cycles of the original clock of the input signal on line 304.

Fractional phase detector 322 includes a generator 324 that generates the output clock signal on line 302 from the feedback phase value on line 306. In one embodiment, generator 324 extracts the most significant bit from the fractional value of register 310 to produce the output clock signal on line 302. In another embodiment, generator 324 adds a predetermined phase to the feedback phase value on line 306, and generator 324 then extracts the most significant bit from the fractional part of the result of the addition to shift the phase of the produced output clock signal on line 302. Note that generator 324 is shown in FIG. 3 as being included in fractional phase detector 322, for clarity. However, generator 324 can be implemented as a circuit separate from fractional phase detector 322, if desired.

To calculate the expected phase of the input signal on line 304 from the feedback phase value on line 306, divider 326 numerically divides the feedback phase value on line 306 by the fixed or programmable value N from register 328 and multiplier 330 numerically multiples the result from the division by the fixed or programmable value M from register 332. The result on line 334 from multiplier 330 is the expected phase of the input signal on line 304. The phase of the input signal on line 304 is expected to be a phase of zero when the output clock signal on line 302 is synchronized with the input signal on line 304.

In one embodiment, the input signal on line 304 consists of E1 data clocked at 2.048 MHz clock and the output clock signal on line 302 consists of a derived T1 clock at 1.544 MHz. In this embodiment, N is 256 and divider 326 includes connections that shift the feedback value on line 306 by eight bits. Because M is 193=128+64+1, multiplier 330 is a three-input adder that adds appropriately shifted versions of the value from shifting divider 326.

In another embodiment, N is not a power of two. Instead, the 360 degrees of phase are divided into N times $2^K$ increments. Register 310 includes an optional prescalar 336 for counting these increments modulo N. The carry-out from prescalar 336 increments a K-bit binary fraction. Adder 314 generally adds the offset value on line 316 to both the value in the prescalar 336 and the K-bit binary fraction. The prescalar 336 can eliminate division by N in fractional phase detector 322.

Transition detector 338 detects transitions of the input signal on line 304. If the input signal on line 304 is a data signal, transition detector can detect transitions sporadically. Transition detector 338 indicates a detected transition on line 340 to the loop filter 342 and the sampler 344 for the phase error. Whenever the transition detector 338 detects a transition, sampler 344 samples the currently expected phase of the input signal on line 304 relative to the output clock signal on line 302. Sampler 344 provides a phase error value on line 346 to the loop filter 342.

Loop filter 342 filters the phase errors on line 346 using the detected transition indicator on line 340. From the possibly sporadically received phases errors on line 346, loop filter 342 generates a continuously available offset value on line 316 that acts to keep the output clock signal on line 302 synchronized with the input signal on line 304.

Figure 4:
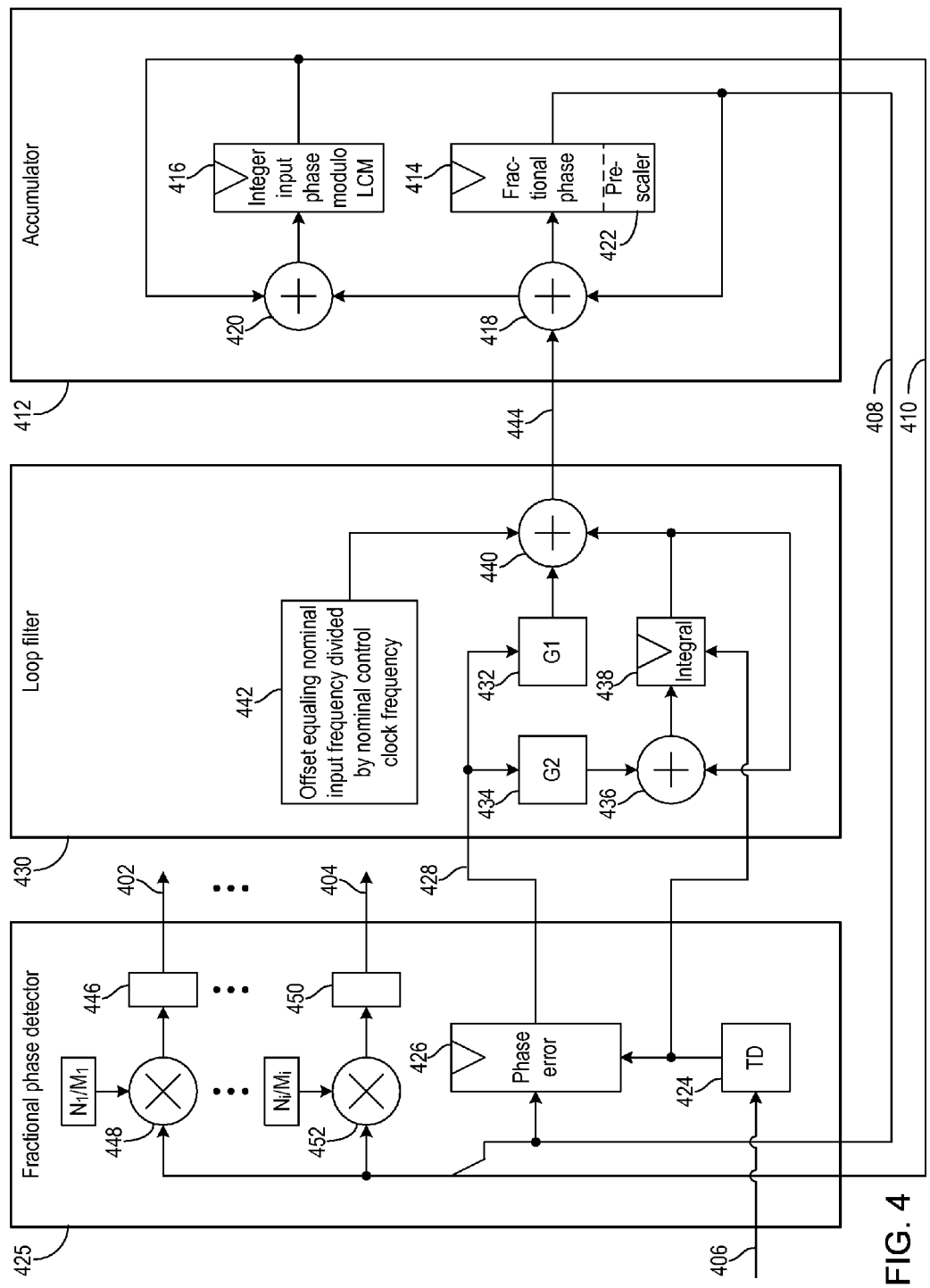
FIG. 4 is a block diagram of a circuit for generating multiple output clock signals from an input clock or data signal in accordance with various embodiments of the invention.

FIG. 4 is a block diagram of a circuit for generating multiple output clock signals on lines 402 through 404 from an input clock or data signal on line 406 in accordance with various embodiments of the invention. The numerical phase value on lines 408 and 410 predicts the phase of the input signal on line 406, and the output clock signals on lines 402 and 404 are derived from the numerical phase value on lines 408 and 410.

Each of the output clock signals on respective lines 402 through 404 has a frequency that multiplies the frequency of the original clock of the input signal on line 406 by a ratio $N_i|M_i$ of integers $N_i$ and $M_i$ for the output clock signal i. The integers $M_i$ have a least common multiple (LCM) and a matching interval is the LCM number of cycles of the original clock for the input signal on line 406. The original clock for the input signal on line 406 and the output clock signals on lines 402 through 404 all have a whole number of clock cycles during the matching interval. The feedback phase value on lines 408 and 410 estimates or predicts the phase of the input signal on line 406 within the matching interval. The feedback phase value on lines 408 and 410 determines the phases of the output clock signals on lines 402 and 404.

The accumulator 412 includes a register 414 for storing a fractional part of the feedback phase and a register 416 for storing an integer part modulo the LCM of the feedback phase. When adder 418 for the fractional part generates a carry-out, adder 420 increments the integer value in register 416 modulo the LCM. In one embodiment, the fractional part includes a prescalar 422 for adding modulo the LCM, for example.

The transition detector (TD) 424 of the fractional phase detector 425 detects transitions of the input signal on line 406. At each transition, sampler 426 samples the fractional part on line 408 of the numerical phase value that predicts the phase of the input signal on line 406. If the feedback phase value on lines 408 and 410 is synchronized with the input signal on line 406, then the fractional part of the phase value on line 408 is zero, which is output on line 428. Otherwise, sampler 426 outputs a magnitude of the phase error on line 428.

In one embodiment, loop filter 430 filters the phase error value on line 428 with a proportional term and an integral term. The proportional term has a gain G1 provided by multiplier 432 and the integral term has a gain G2 provided by multiplier 434. At each detected transition of the input signal on line 406, adder 436 adds to the value in register 438. Adder 436 adds the phase error value on line 428 multiplied by the gain G2 of multiplier 434 to the value in register 438. Register 438 is not updated when transition detector 424 does not detect a transition during a particular cycle of the high-frequency clock (not shown in FIG. 4).

Each cycle of the high-frequency clock, adder 440 outputs the sum of the proportional term of the phase error from sampler 426 multiplied by the gain G1 of multiplier 432, the integral term from register 438, and a constant offset 442. The constant offset 442 is the nominal frequency of the original clock for the input signal on line 406 divided by the nominal frequency of the high-frequency clock. It will be appreciated that the constant offset 442 can be stored in a register. Adder 440 outputs the offset value on line 444.

Generator 446 generates output clock signal 402 from the phase value obtained from multiplier 448 calculating $N_1|M_1$ times the numerical phase value on lines 408 and 410 that predicts the phase of the input signal on line 406. In one embodiment, generator 446 outputs the most significant bit of a fractional part of the value from multiplier 448. Optional prescalar 442 permits multiplier 448 to multiply by $N_1|M_1$ without performing a division step. Generator 450 similarly generates the output clock signal on line 404 from $N_i|M_i$ multiplied by the phase value, from multiplier 452. Note that multipliers 448 to 452 and generators 446 to 450 are shown in FIG. 4 as being included in fractional phase detector 425, for clarity. However, some or all of these circuits can be implemented as one or more circuits separate from fractional phase detector 425, if desired.

Referring back to FIG. 3, it will be appreciated that fractional phase detector 322 can generate one or more additional output clock signals that each have a whole number of clock cycles during the matching interval. Each additional output clock signal could be generated from the feedback phase value on line 306 by a multiplier and generator similar to multiplier 448 and generator 446 of FIG. 4. The matching interval could be the shortest time interval including a whole number of cycles of all of the clock signals, and the register 312 could track the number of cycles of the output clock signal on line 302 during this matching interval. In addition, registers 328 and 332 could be programmed to have the value of one, such that the output clock signal on line 302 synchronizes to the original clock of the input signal on line 304, while also generating the additional output clock signals.

The present invention is thought to be applicable to a variety of systems for generating clock signals from data signals and/or clock signals. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A circuit for generating an output clock signal from an input signal, the input signal having a plurality of transitions derived from a plurality of transitions of an original clock signal, the original clock signal having a first frequency that differs from a second frequency of the output clock signal, wherein the second frequency is a product of the first frequency and a ratio of a first integer value over a second integer value, the circuit comprising:
   an accumulator for periodically adding an offset value to a phase value of the output clock signal, the phase value having an integer part and a fractional part, wherein the periodically adding includes adding the offset value to the fractional part with a carryout, and adding the carryout to the integer part modulo the first integer value;
   a fractional phase detector coupled to the accumulator for generating, for each of the plurality of transitions of the input signal, a respective phase error that is a product of the phase value at the transition and a ratio of the second integer value over the first integer value;
   a loop filter coupled to the accumulator and the fractional phase detector, the loop filter for generating the offset value from a filtering of the respective phase errors; and
   a generator coupled to the accumulator for generating the output clock signal from the phase value.

2. The circuit of claim 1, wherein the accumulator generates the phase value of the output clock signal within a plurality of cycles of the output clock signal.

3. The circuit of claim 1, wherein the output clock signal comprises a most significant bit of a plurality of bits of the fractional part of the phase value.

4. A circuit for generating a plurality of output clock signals from an input signal, the input signal having a plurality of transitions derived from a plurality of transitions of an original clock signal, the original clock signal having a first frequency that differs from a respective second frequency of each output clock signal, wherein each respective second frequency is a product of the first frequency and a ratio of a respective first integer value over a respective second integer value, the circuit comprising:

an accumulator for periodically adding an offset value to a phase value that includes an integer part and a fractional part, wherein the periodically adding includes adding the offset value to the fractional part with a carryout, and adding the carryout to the integer part modulo a common multiple of all of the second integer values, wherein each output clock signal is generated from a product of the phase value and the ratio of the respective first integer value over the respective second integer value;

a fractional phase detector coupled to the accumulator for generating, for each of the transitions of the input signal, a respective phase error that is the fractional part of the phase value at the transition; and a loop filter coupled to the accumulator and the fractional phase detector, the loop filter for generating the offset value from a filtering of the respective phase errors.

5. The circuit of claim 4, wherein the accumulator generates the phase value within a number of cycles at the first frequency, the number being a least common multiple of all of the second integer values.

6. The circuit of claim 4, wherein each of the output clock signals comprises a most significant bit of a plurality of bits of a fractional part from the product of the phase value and the ratio of the respective first integer value over the respective second integer value.

7. A circuit for generating at least one output clock signal from an input signal having a first plurality of transitions derived from a second plurality of transitions of an original clock signal, the original clock signal having a first frequency that differs from a second frequency of the output clock signal, the second frequency being a product from multiplying the first frequency and a ratio of a first integer value over a second integer value, the circuit comprising:

an accumulator for periodically adding a numerical offset value to a numerical phase value, wherein the output clock signal is generated from the numerical phase value;

a fractional phase detector coupled to the accumulator for generating from the numerical phase value a respective numerical phase error for each of the transitions of the input signal;

wherein the fractional phase detector non-periodically updates the respective numerical phase errors in response to the transitions of the input signal not being periodic, and the fractional phase detector periodically updates the respective numerical phase errors in response to the transitions of the input signal being periodic; and a loop filter coupled to the accumulator and the fractional phase detector, the loop filter for generating the numerical offset value from a filtering of the respective numerical phase errors;

wherein the loop filter periodically generates the numerical offset value in response to the fractional phase detector non-periodically and periodically updating the respective numerical phase errors.

8. The circuit of claim 7, wherein the accumulator generates the numerical phase value within a plurality of cycles of the output clock signal, and wherein the fractional phase detector, for each transition of the input signal, generates the respective numerical phase error by multiplying the numerical phase value at the transition and a ratio of the second integer value over the first integer value.

9. The circuit of claim 7, wherein:
the circuit generates a plurality of output clock signals, each output clock signal having a respective frequency, each respective frequency being a product from multiplying the numerical phase value and a ratio of a respective numerator integer value over a respective denominator integer value, the accumulator generates the numerical phase value within a number of cycles at the first frequency, the number being a least common multiple of the denominator integer values, and the fractional phase detector, for each transition of the input signal, generates the respective numerical phase error, the respective numerical phase error being a fractional part of the numerical phase value at the transition.

10. The circuit of claim 7, wherein the fractional phase detector generates a count of the transitions of the input signal modulo the second integer value and, for each transition of the input signal, generates the respective numerical phase error, the respective numerical phase error being a difference between the numerical phase value and a predetermined numerical value for the count at the transition.

11. The circuit of claim 7, wherein the first plurality of transitions of the input signal includes at least one of every positive transition of the input signal and every negative transition of the input signal.

12. The circuit of claim 7, wherein the input signal is the original clock signal.

13. The circuit of claim 7, wherein the input signal is an input data signal having the first plurality of transitions associated with a subset of the second plurality of transitions of the original clock signal.

14. The circuit of claim 7, wherein the numerical phase value is a binary bit vector stored in a register of the accumulator.

15. The circuit of claim 7, wherein the numerical phase value includes a fractional part and an integer part, the integer part being the numerical phase value modulo an integer value.

16. The circuit of claim 7, further comprising a control port for receiving a control clock signal having a higher frequency than the first and second frequencies, wherein the accumulator periodically adds the numerical offset value to the numerical phase value at each active transition of the control clock signal.

17. The circuit of claim 7, wherein the output clock signal comprises a most significant bit of a plurality of bits of a fractional part of the numerical phase value.

18. The circuit of claim 7, wherein the numerical offset value comprises a sum of a numerical correction value from the filtering of the numerical phase errors and a predetermined numerical value, the predetermined numerical value being a nominal value for one of the first and second frequencies divided by a nominal value of a rate of the periodically adding the numerical offset value to the numerical phase value.

19. The circuit of claim 7, wherein the loop filter generates the numerical offset value from a numerical correction value that is a sum of a first value and a second value, wherein the first value is proportional to the respective numerical phase error, and the second value is proportional to an integration of the respective numerical phase error at each of the first plurality of transitions.

* * * * *